United States Patent
Schweitzer, Jr. et al.

(10) Patent No.: US 6,433,698 B1
(45) Date of Patent: *Aug. 13, 2002

(54) FAULT INDICATOR PROVIDING LIGHT INDICATION ON FAULT DETECTION

(75) Inventors: Edmund O. Schweitzer, Jr., Northbrook, IL (US); Kirk S. Thomas, Kenosha, WI (US)

(73) Assignee: E.O. Schweitzer Mfg. Co., Mundelein, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 48 days.

This patent is subject to a terminal disclaimer.

(21) Appl. No.: 09/281,012

(22) Filed: Mar. 30, 1999

Related U.S. Application Data

(63) Continuation of application No. 09/070,224, filed on Apr. 30, 1998, now abandoned.

(51) Int. Cl.[7] ............................................... G08B 21/00
(52) U.S. Cl. .................... 340/664; 340/691.6; 340/635; 361/93; 324/133; 324/419
(58) Field of Search ................................ 340/635, 664, 340/657, 691.6; 361/91, 1, 93; 324/133, 418, 419

(56) References Cited

U.S. PATENT DOCUMENTS

| | | | | |
|---|---|---|---|---|
| 3,229,274 A | * | 1/1966 | Riley et al. | 340/664 |
| 3,708,724 A | * | 1/1973 | Schweitzer | 361/75 |
| 3,866,197 A | * | 2/1975 | Schweitzer | 340/651 |
| 3,876,911 A | * | 4/1975 | Schweitzer | 361/102 |
| 3,974,446 A | * | 8/1976 | Schweitzer | 324/133 |
| 4,424,512 A | * | 1/1984 | Schweitzer | 340/664 |
| 4,811,153 A | * | 3/1989 | Sakatos | 361/88 |
| 5,497,096 A | * | 3/1996 | Banting | 324/555 |
| 5,811,896 A | * | 9/1998 | Grad | 324/419 |

* cited by examiner

*Primary Examiner*—Daniel J. Wu
(74) *Attorney, Agent, or Firm*—Cook, Alex, McFarron, Monzo, Cummings & Mehler (57) ABSTRACT

A fault indicator for detecting the occurrence of a fault current in a monitored conductor and providing a light indication thereof includes a rotatably mounted indicator flag. The flag is positioned in either a reset indicating or a fault indicating state by a magnetic pole piece, which is magnetized in one magnetic direction or the other by momentary application of a current in one direction or the other to an actuator winding on the pole piece. A magnetically actuated reed switch in an auxiliary magnetic circuit comprising an auxiliary pole piece magnetized by the actuator winding and a bias magnet magnetically aligned to oppose the reset magnetic orientation and reenforce the trip magnetic orientation of the magnetic pole piece closes upon occurrence of the fault current to connect an internal lithium battery to an LED visible from the exterior of the fault indicator housing.

18 Claims, 5 Drawing Sheets

FAULT INDICATOR PROVIDING LIGHT INDICATION ON FAULT DETECTION

This application a continuation of application Ser. No. 09/070,224, filed Apr. 30, 1998, now abandoned.

BACKGROUND OF THE INVENTION

The present invention relates generally to current sensing devices for electrical systems, and more particularly to resettable alternating current fault indicators.

Various types of self-powered fault indicators have been constructed for detecting electrical faults in power distribution systems, including clamp-on type fault indicators, which clamp directly over cables in the systems and derive their operating power from inductive coupling to the monitored conductor, and test point type fault indicators, which are mounted over test points on cables or associated connectors of the systems and derive their operating power from capacitive coupling to the monitored conductor. Such fault indicators may be either of the manually reset type, wherein it is necessary that the indicators be physically reset, or of the self-resetting type, wherein the indicators are reset upon restoration of line current. Examples of such fault indicators are found in products manufactured by E.O. Schweitzer Manufacturing Company of Mundelein, Ill., and in U.S. Pat. Nos. 3,676,740, 3,906,477, 4,063,171, 4,234,847, 4,375,617, 4,438,403, 4,456,873, 4,458,198, 4,495,489, 4, 4,974,329, and 5,677,678 of the present inventor.

Detection of fault currents in fault indicators is typically accomplished by means of magnetic switch means such as a magnetic reed switch in close proximity to the conductor being monitored. Upon occurrence of an abnormally high fault-associated magnetic field around the conductor, the magnetic switch actuates a trip circuit which produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position.

In certain applications, such as where the fault indicator is installed in a dark or inaccessible location, the need arises for a light indication in addition to the flag indication. Repair crews can then more easily find the location of the fault.

Because of the compact construction and limited power available in self-powered fault indicators it is preferable that the light indication be provided with minimal additional circuitry and structure within the fault indicator while providing reliable and extended operation following occurrence of a fault. The present invention is directed to a novel fault indicator light circuit which meets the above requirements by utilizing a magnetic winding, such as the actuator winding of the electro-mechanical indicator flag assembly typically utilized in fault indicators, in conjunction with a magnetic circuit to connect an internal battery upon occurrence of a fault.

Accordingly, it is a general object of the present invention to provide a new and improved fault indicator having a light indication of fault occurrence.

It is a more specific object of the present invention to provide a new and improved self-powered fault indicator which provides a light indication for an extended period of time following occurrence of a fault current in a monitored conductor.

It is a still more specific object of the present invention to provide a fault indicator wherein a light-indication is provided utilizing the electromagnetic flag indicator assembly of the fault indicator in conjunction with an internal battery.

SUMMARY OF THE INVENTION

The invention is directed to a fault indicator for indicating the occurrence of a fault current in an electrical conductor. The fault indicator comprises a housing, a battery, a lamp operable from the battery and viewable from the exterior of the housing, a magnetic circuit including a magnetic pole piece, a magnetically actuated switch and a bias magnet, the bias magnet having a magnetic polarity which opposes a magnetic field in the magnetic pole piece in one direction, and reenforces a magnetic field in the magnetic pole piece in the other direction, whereby the magnetically actuated switch is conditioned to open in response to a magnetic field in the one direction and closed in response to a magnetic field in the other direction, means including a magnetic winding in magnetic communication with the magnetic pole piece and responsive to the current in the monitored conductor for developing a magnetic field in the magnetic pole piece in the one direction to condition the switch open during normal current flow in the monitored conductor, and for developing a magnetic field in the magnetic pole piece in the opposite direction to condition the switch closed upon occurrence of a fault current in the conductor, the magnetically actuated switch connecting the battery to the lamp whereby the lamp lights in the fault indicating state.

The invention is further directed to a fault indicator for indicating the occurrence of a fault current in an electrical conductor. The fault indicator comprises a housing, a battery, a lamp operable from the battery and viewable from the exterior of the housing, an indicator flag assembly including an indicator flag viewable from the exterior of the housing and a first magnetic pole piece, the indicator flag being magnetized and in magnetic communication with the first magnetic pole piece whereby the indicator flag is actuated to a reset-indicating position by a magnetic field in the first magnetic pole piece in one direction, and is actuated to a fault-indicating position by a magnetic field in the first magnetic pole piece in the opposite direction, a second magnetic pole piece, a magnetically actuated switch and a bias magnet, the bias magnet having a magnetic polarity which opposes magnetic field in the second magnetic pole piece in one direction, and reenforces magnetic field in the second magnetic pole piece in the other direction, whereby the magnetically actuated switch is actuated open in response to a magnetic field in the one direction and closed in response to a magnetic field in the other direction, means including a magnetic winding in magnetic communication with the first and second magnetic pole pieces and responsive to the current in the monitored conductor for developing a magnetic field in the one direction in the pole pieces to position the indicator flag in the reset indicating position and condition the magnetically actuated switch in the first state during normal current flow in the monitored conductor, and for developing a magnetic field in the opposite direction in the pole pieces to position the indicator flag in the fault indicating position and condition the magnetically actuated switch closed upon occurrence of a fault current in the conductor, the magnetically actuated switch connecting the battery to the lamp whereby the lamp lights in the fault indicating state.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
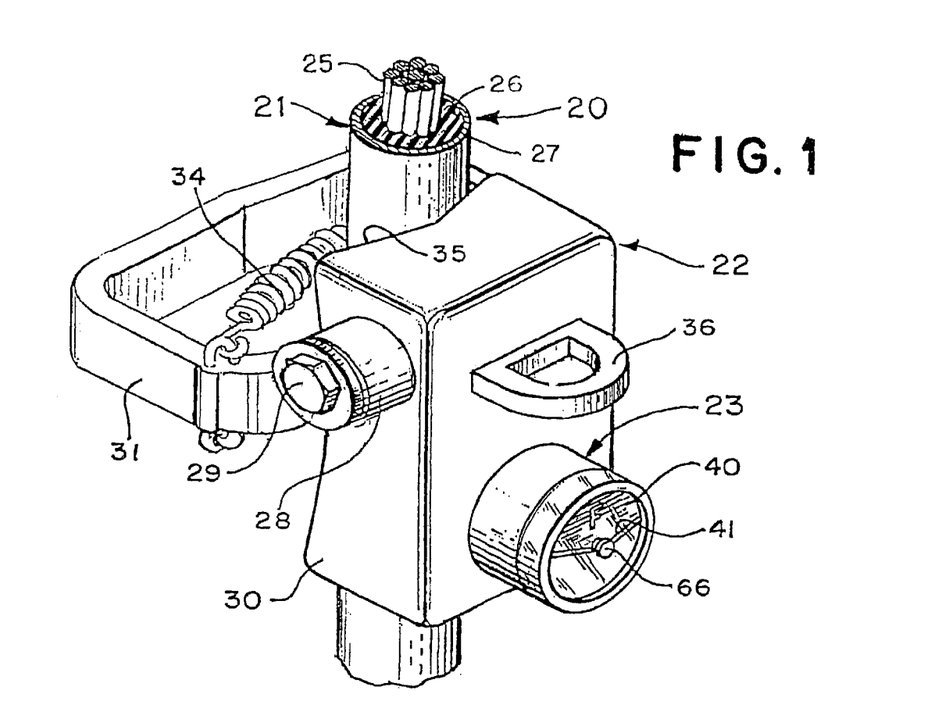
FIG. 1 is a perspective view of an inductively powered clamp-on fault indicator constructed in accordance with the invention installed on a cable within a power distribution system.

Referring to the Figures, and particularly to FIG. 1, a clamp-on current-reset fault indicator 20 constructed in accordance with the invention for indicating fault currents in an electrical feeder or distribution cable 21 is seen to include a circuit module 22 and an integral indicator module 23. The indicator module 23 projects from the front face of the circuit module so as to be easily viewed when the fault indicator is installed. In accordance with conventional practice, the circuit module is attached to the outer surface of cable 21, which may include a central conductor 25, a concentric insulating layer 26, and an electrically-grounded rubber outer sheath 27.

Basically, circuit module 22 includes a housing 30 within which circuitry for sensing fault currents and actuaing indicator module 23 is contained, and a magnetic core assembly 31 for attaching the module to a monitored conductor (such as cable 21) and for providing sufficient magnetic coupling to the conductor to power the circuitry of the circuit module. The core assembly is preferably formed as a closed loop of generally rectangular configuration so as to completely encircle cable 21, and includes a gap 32 by which the core can be opened to facilitate installation on or removal from a monitored conductor. A hook 33 on the core and an eye 36 on housing 30 may be provided to allow use of a conventional hotstick during installation or removal. A spring 34 holds the gap closed and presses the monitored cable 21 into a V-shaped recess 35 on housing 30. A battery holder 28 positioned on the side of housing 30 includes a removable end cap 29 which provides access to a cylindrical battery compartment within which a battery 36 (FIG. 3) is contained.

The indicator module 23 also includes, in accordance with conventional practice, a status-indicating flag 40 for indicating circuit status. The flag 40 may be viewed through a window 41 at the front of the indicator module.

In operation, during normal current flow in conductor 21, indicator flag 40 is positioned by circuitry in circuit module 22 so as to present a white or reset condition-indicating surface 40A to the viewer. Upon the occurrence of a fault current in the conductor, the indicator flag is repositioned by the circuitry so as to present a red or fault-indicator surface 40B to the viewer.

Figure 2:
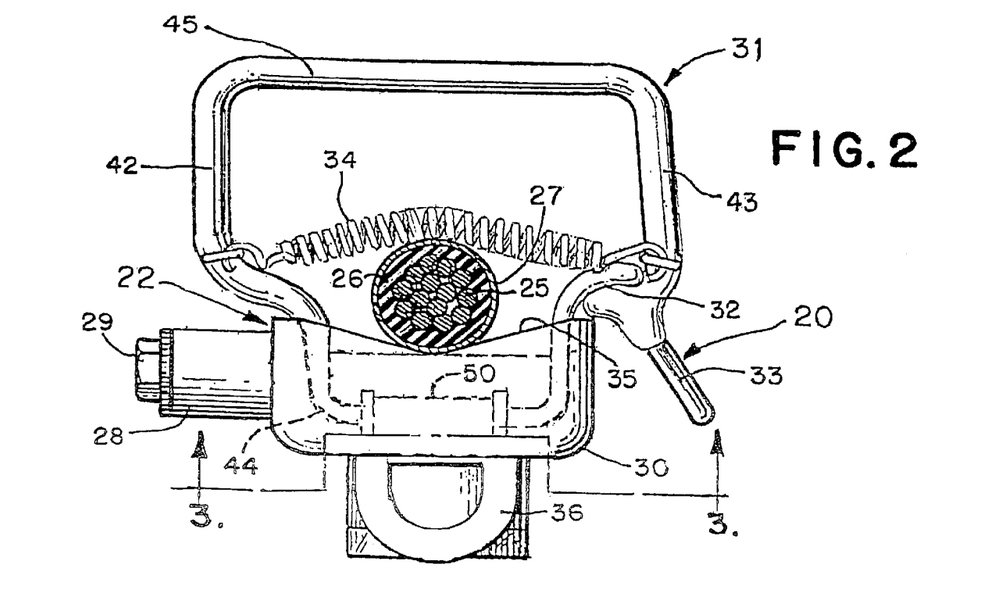
FIG. 2 is a top plan view of the fault indicator of FIG. 1 showing engagement between the fault indicator and the cable.

Referring to FIG. 2, the core assembly 31 of circuit module 22 may consist of a plurality of individual strips or laminations formed of oriented silicon steel arranged side-by-side in a generally rectangular closed-loop configuration. The core assembly is preferably encapsulated in a layer of resin epoxy insulating material. The rectangular configuration includes a generally rectilinear first or left side portion 42, a generally rectilinear second or right side portion 43 opposed to first portion 42, a generally rectilinear third or bottom portion 44 and a generally rectilinear fourth or top portion 45 opposed to third portion 44. The closed loop consisting of side portions 42–45 includes gap 32 at the juncture of left side core portion 42 and bottom core portion 44. The left side portion 42 is drawn toward the right side portion 43 by a helical spring 34 which extends between the two opposite sides of the core.

Figure 3:
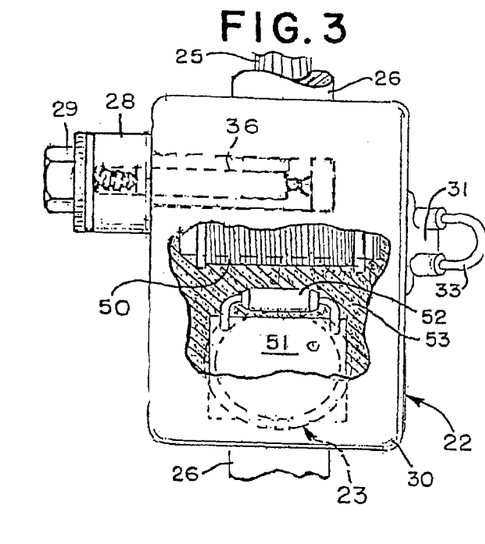
FIG. 3 is a cross-sectional view of the fault indicator of FIGS. 1 and 2 taken along line 3—3 of FIG. 2.
Figure 4:
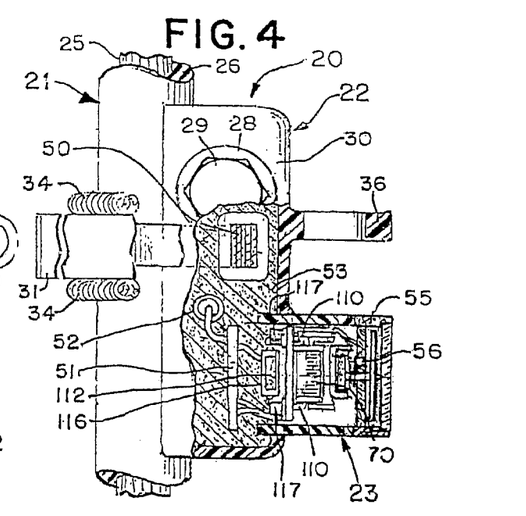
FIG. 4 is a cross-sectional view of the fault indicator of FIGS. 1–3 taken along line 4—4 of FIG. 3.

To provide operating power for the fault indicator circuit module 22 includes a magnetic winding 50 in magnetic communication with magnetic core assembly 31. As shown in FIGS. 2 and 3, winding 50 is coaxially positioned on the bottom portion 44 of the core assembly and is dimensioned to provide a close fit with the core cross section. The winding is preferably connected to a circuit board 51 on which the other components of the circuit module are mounted. These components include a magnetic reed switch 52, which is positioned with its axis perpendicular to and spaced from the axis of conductor 21 so as to respond to fault currents in the conductor in a manner well known to the art. The entire assembly, consisting of winding 50, circuit board 51, magnetic reed switch 52 and the other components of the module, may be encapsulated in an epoxy material 53 so as to form within housing 30 at the bottom portion of core assembly 31 a weatherproof module responsive to the current level in conductor 21.

Figures 5, 6:
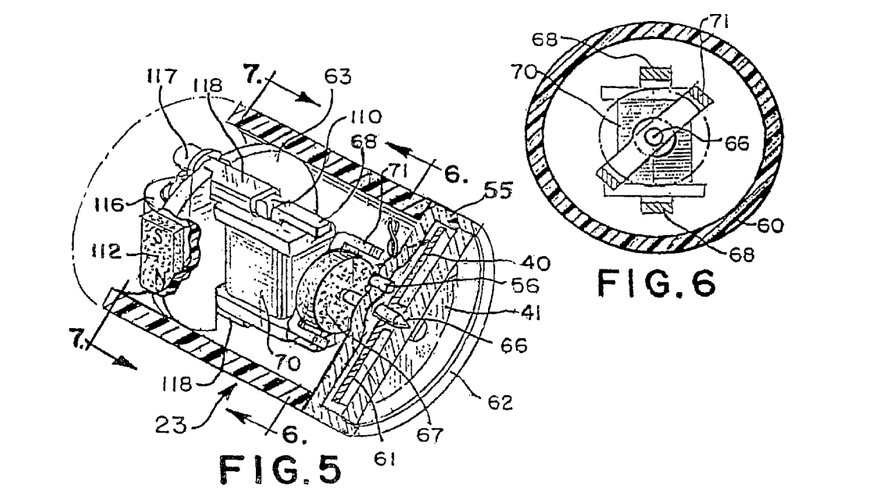
FIG. 5 is a perspective view, partially in section, showing the principal components of the indicator flag assembly utilized in the fault indicator of FIGS. 1–4.
FIG. 6 is a cross-sectional view of the indicator flag assembly taken along line 6—6 of FIG. 5.
Figures 7, 7A:
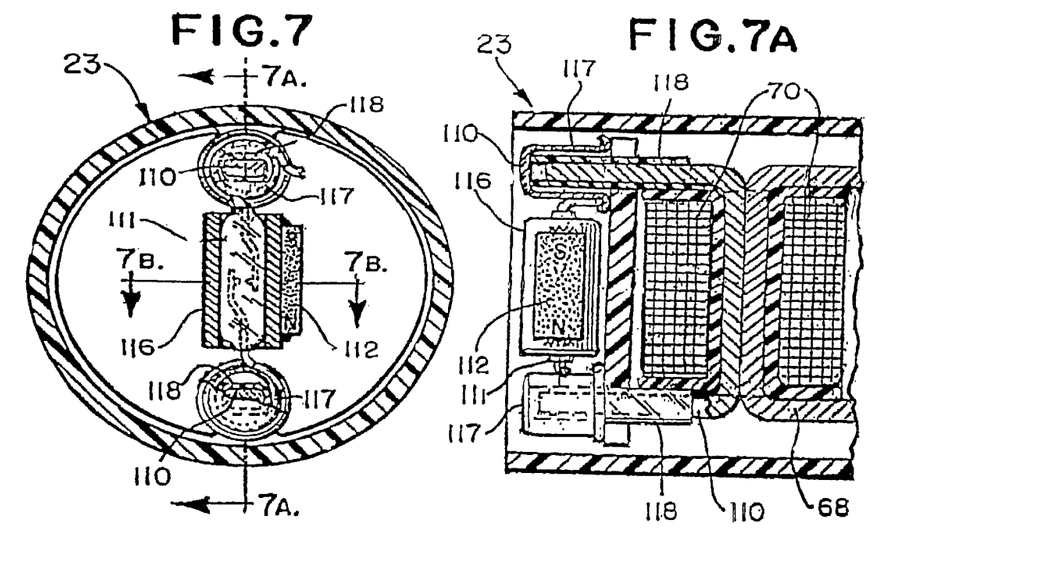
FIG. 7 is an enlarged cross-sectional view of the auxiliary contacts of indicator flag assembly taken along line 7—7 of FIG. 5.
FIG. 7A is a cross-sectional view of the indicator assembly taken along line 7A—7A of FIG. 7.
Figure 7B:
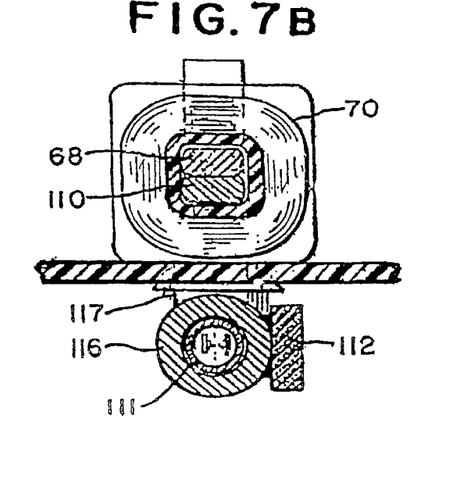
FIG. 7B is a cross-sectional view of the indicator assembly taken along line 7B—7B of FIG. 7.

Referring to FIG. 5, indicator module 23, which may be conventional in structure and operation, includes a cylindrical plastic housing 60 within which the components of the module are contained. The projecting end of housing 60 includes a transparent section 55 through which an internal signal lamp 56 can be viewed. Within housing 60 an integral partition 61 serves as a mask and spacing element and a support for lamp 56, and a transparent end cap 62 sonically welded to the end of the housing seals the interior against contamination while providing the viewing window 41 (FIG. 1).

A disc-shaped circuit board 63 is positioned perpendicularly to the axis of the housing. This circuit board, which may be secured in position by an epoxy material filling the rear portion of the housing, serves as mounting means for the components of the indicator module.

Figures 8A, 8B, 9A, 9B, 10A, 10B:
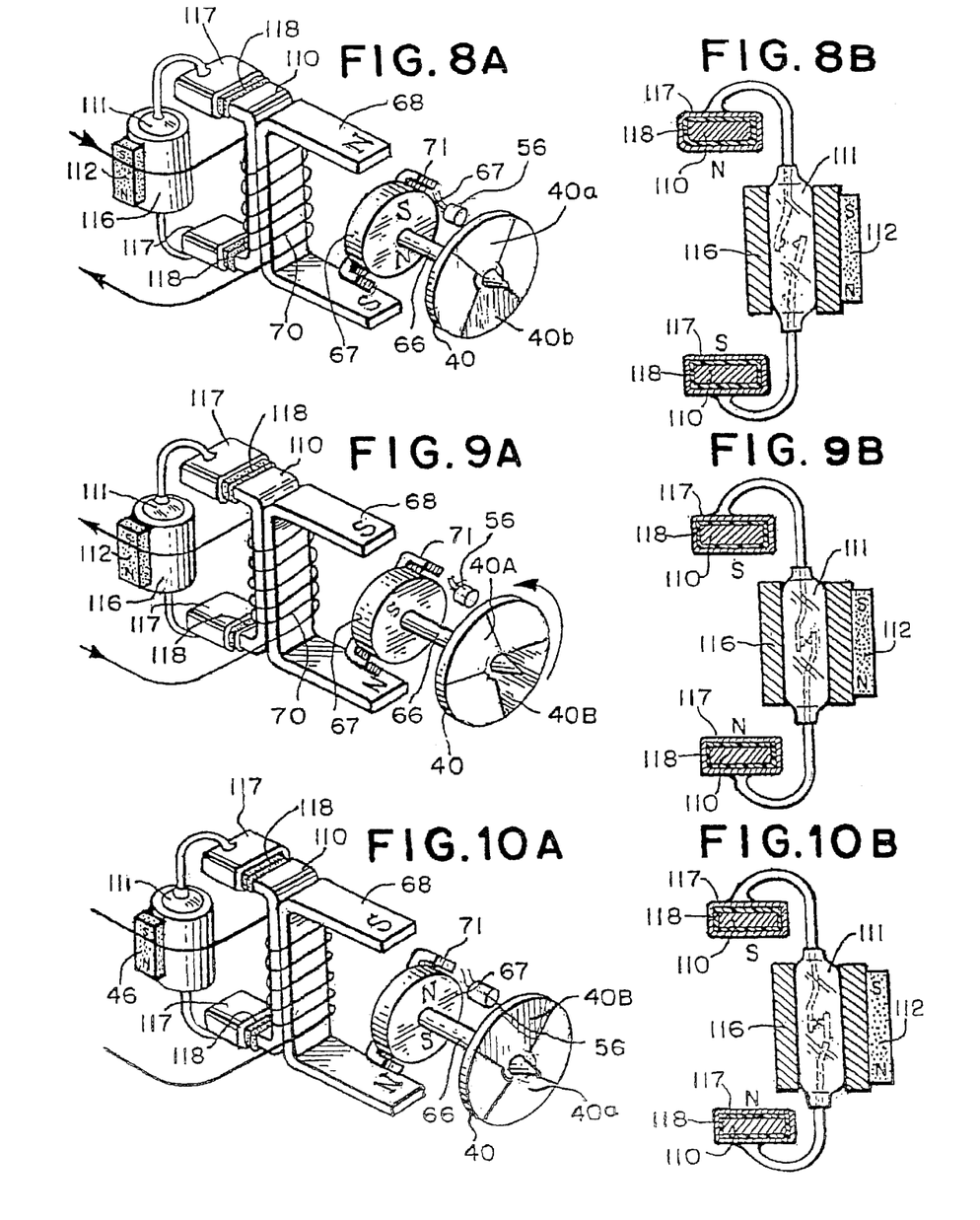
FIGS. 8A and 8B are diagrammatic views of the principal components of the indicator flag assembly of the fault indicator in a reset indicating position.
FIGS. 9A and 9B are diagrammatic views similar to FIGS. 8A and 8B, respectively, showing the principal components of the indicator flag assembly in transition between a reset indicating position and a fault indicating position.
FIGS. 10A and 10B are diagrammatic views similar to FIGS. 8A and 8B, respectively, showing the principal components of the indicator flag assembly in a fault indicating position.

To provide an indication of the occurrence of a fault current, the indicator module includes within the lower end of housing 60 the generally disc-shaped indicator flag 40 mounted for rotation about a pivot axis 66. As best seen in FIGS. 8–10, the face of target indicator 40 has a red segment 40B and a white segment 40A, only one of which is visible at a time through window 41 in the transparent end of housing 60.

Secured to and pivotal with indicator flag 40 is a permanent flag magnet 67 which is formed of a magnetic material having a high coercive force, such as ceramic, and is magnetically polarized to form two magnetic poles of opposite polarity, as indicated in FIGS. 8–10, with opposite magnetic polarities along a diameter of the magnet.

A pole piece 68, which is preferably formed of a magnetic material having a relatively low coercive force, such as chrome steel, in a reset condition is biased at its projecting ends of the magnetic polarities indicated in FIGS. 8A and 8B. As shown in FIG. 5 the ends of the pole piece extend along the side wall of housing 60, in close proximity to flag magnet 67. As a result, the opposite polarity magnetic poles of flag magnet 67 are attracted to position the indicator flag 40 to the reset or non-tripped position shown. In this position the red segment 40B of the indicator flag is not visible through window 41, and all that is seen is white segment 40A.

On the occurrence of a fault current in conductor 21 pole piece 68 is remagnetized to the magnetic polarities shown in FIGS. 9 and 10 by momentary energization in one direction of a winding 70 on the center section the pole piece. As a result, the poles of magnet 67 are repelled by the adjacent like-polarity poles of the pole piece and indicator flag 40 is caused to rotate 180° to its tripped position, as shown in FIGS. 10A and 10B. In this position, the red segment 40B of indicator flag 40 is visible through window 41, and a lineman viewing the fault indicator is advised that a fault current has occurred in the conductor.

Indicator flag 40 remains in its fault indicating position until the ends of pole piece 68 are subsequently remagnetized to the magnetic polarities shown in FIGS. 8A and 8B, by momentary energization of winding 70 with a current in the opposite direction. Upon this happening, indicator flag 67, and hence indicator flag 40, is caused to rotate from the tripped position shown in FIGS. 10A and 10B to the reset position shown in FIGS. 8A and 8B, and the fault indicator is conditioned to respond to a subsequent fault current.

To preclude indicator flag 40 from becoming stalled upon reversal of the magnetic polarities of pole piece 68, as might happen with a target perfectly centered between the poles of the pole piece and having a degree of bearing friction, the fault indicator includes an auxiliary U-shaped pole piece 71 positioned adjacent target magnet 67 coaxial with and at an angle to pole piece 68. The existence of a magnetic field between the poles of pole piece 68 results in the production of induced magnetic poles in auxiliary pole piece 71. As a result, upon reversal of the magnetic polarity of the poles of pole piece 68 following occurrence of a fault current the auxiliary poles exert a rotational force on the most adjacent poles of the target magnet 67. This causes a rotational moment to be exerted on flag indicator 40 tending to turn the flag in a predetermined (counter-clockwise in FIGS. 8-10) direction such that the flag is precluded from remaining in its reset position, even if it should be perfectly positioned and have a degree of bearing friction. Once rotation has been established, as shown in FIGS. 9A and 9B, the greater force of the main pole piece 68 overcomes the effect of the auxiliary pole piece 71 and rotation continues until the flag is aligned as shown in FIGS. 10A and 10B.

Energization of winding 70 by current in one direction upon occurrence of a fault current in conductor 21, and energization of winding 70 by current in the opposite direction upon restoration of current in conductor 21, is accomplished by means of circuitry contained within circuit module 22. Referring to the schematic diagram shown in FIG. 11, the single winding 70 of indicator module 23 is connected to the circuit module by conductors 74 and 75.

Figure 11:
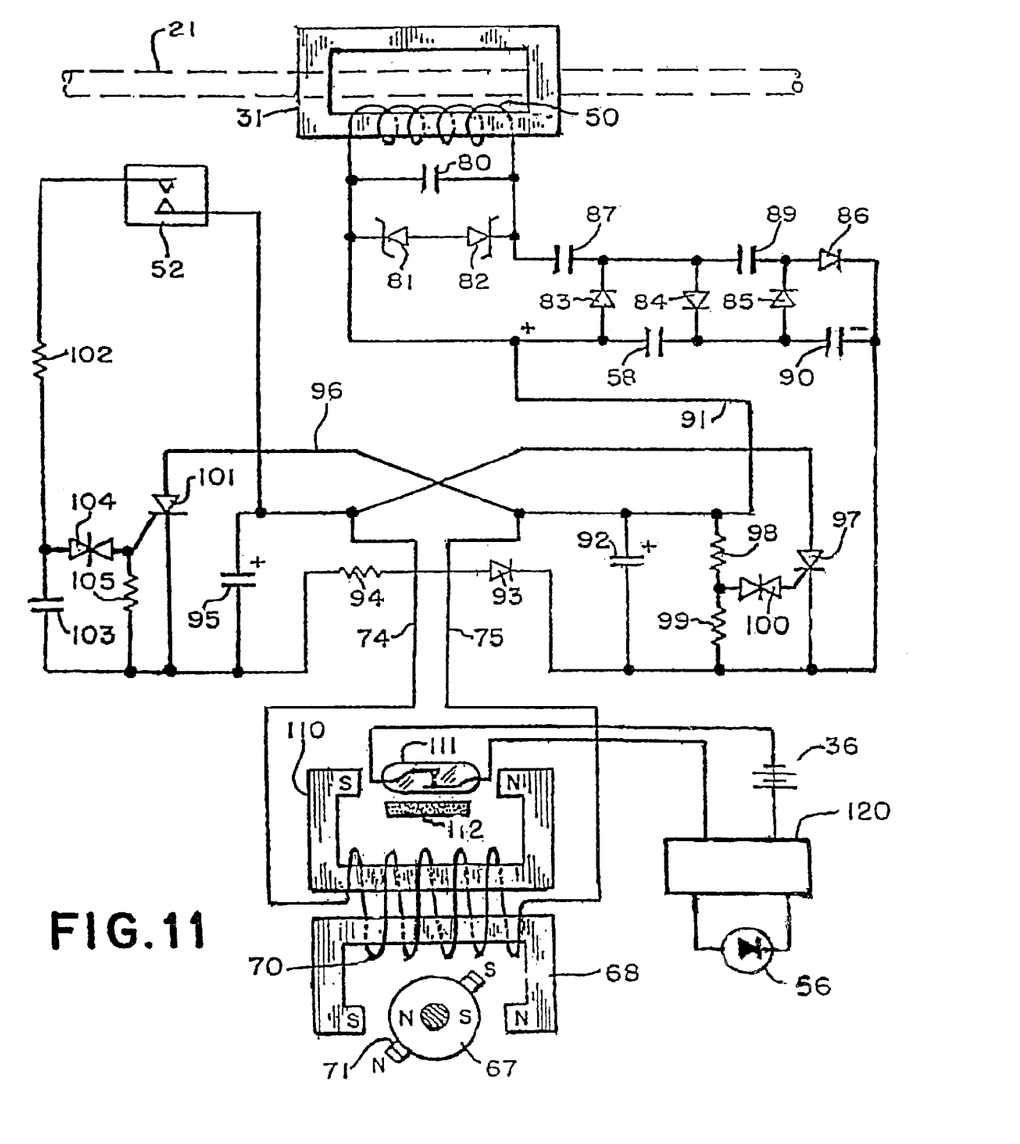
FIG. 11 is an electrical schematic diagram of the circuitry of the fault indicator shown in FIGS. 1–5.

Power for operation of the circuit module is obtained from pick-up winding 50, within which an alternating current is induced in a manner well known to the art as a consequence of alternating current in conductor 21. Winding 50 is tuned to resonance at the power line frequency by a capacitor 80 and the resultant resonant output signal is peak-limited by a pair of zener diodes 81 and 82 connected back-to-back across the winding.

The resonant signal is increased in voltage by a conventional voltage multiplier circuit comprising diodes 83–86 and capacitors 87–90 to develop in a manner well known to the art a direct current of sufficient magnitude for powering the circuitry of the module.

The positive polarity output terminal of the voltage multiplier network, formed at the juncture of diode 83 and capacitor 88, is connected to one terminal of winding 70 through a conductor 91, and to one terminal of a first current storage capacitor 92. The negative polarity output terminal of the voltage multiplier network, formed at the juncture of diodes 86 and capacitor 90, is connected to the remaining terminal of capacitor 92, and through a forward-biased diode 93 and a current limiting resistor 94 to one terminal of a second current storage capacitor 95. The other terminal of capacitor 95 is connected to the remaining terminal of winding 70 through a conductor 96. With this arrangement, capacitor 92 is charged directly, and capacitor 95 is charged through winding 70, by the unidirectional current developed by the voltage multiplier network during normal current flow in conductor 21.

To provide for periodic energization of winding 70 during normal current flow in conductor 21, the remaining end terminal of winding 70 is connected through a first switch device in the form of a silicon controlled rectifier (SCR) 97 to the negative polarity terminal of capacitor 92. Periodic conduction through SCR 97 is obtained by connecting the gate electrode of that device to the positive polarity output terminal of the voltage multiplier network through a voltage divider network comprising a pair of resistors 98 and 99 and a bilateral diode 100. SCR 97 is periodically triggered into conduction when the voltage developed across bilateral diode 100 as a result of capacitor 97 being charged by the voltage multiplier network reaches the threshold level of the diode. This causes a current flow in a first direction in winding 70, with the result that indicator flag 40 is positioned as shown in FIGS. 8A and 8B. Diode 93 prevents capacitor 95 from being discharged through SCR 97 upon conduction of that device, leaving the capacitor available for energizing winding 70 in a reverse direction in response to a fault condition.

Winding 70 is energized in the reverse direction upon occurrence of a fault current in conductor 21 by discharge of capacitor 95 through a second SCR 101 having its cathode connected to the negative polarity terminal of the capacitor, and its anode connected to the first end terminal of winding 70. Conduction is established through SCR 101 by closure of the contacts of reed switch 52, which is connected between the positive polarity terminal of capacitor 95 and the gate electrode of SCR 101 by a network comprising a resistor 102 and a capacitor 103, a bilateral diode 104, and a resistor 105.

Reed switch 52 is positioned within housing 30 in sufficiently close proximity to conductor 21 such that the contacts of the switch close upon occurrence of a fault current in the conductor. Upon this occurrence, the positive polarity terminal of capacitor 95 is connected through the closed contacts of reed switch 52 and the circuit comprising resistors 102 and 105, bilateral diode 104, and capacitor 103 to the gate electrode of SCR 101, causing that device to be rendered conductive. This causes capacitor 95 to discharge through the SCR, energizing winding 70 in the reverse direction and repositioning indicator flag 40 as shown in FIGS. 10A and 10B.

To preclude the possibility of currents of opposite direction being applied to winding 70 by simultaneous conduction of SCR 101 and SCR 97, a predetermined time delay in conduction through SCR 101 may be provided following occurrence of a fault current in conductor 21. This is accomplished by resistor 102 and capacitor 103, which together form an RC time constant network in the gate circuit of SCR 101. Upon closure of the contacts of reed switch 52 it is necessary that capacitor 103 charge through resistor 102 to the threshold voltage of bilateral diode 104 before sufficient gate electrode current is supplied to SCR 101 to initiate conduction in that device. Resistor 105 serves in a conventional manner as a current drain path for the gate electrode.

The time delay provided is designed to insure that should a fault occur simultaneously with the periodic energization of winding 70 in a reset direction, capacitor 92 will have completely discharged prior to winding 70 being energized to signal the fault.

Thus, in operation winding 70 is supplied with unidirectional current in one direction from a first current storage device, capacitor 92, and in an opposite direction from a second current storage device, capacitor 95. Capacitor 92 is connected to one terminal of the magnetic winding, and capacitor 95 is connected to the other terminal. A first switch device, SCR 97, periodically completes the discharge circuit for capacitor. 92 to the opposite terminal of the winding during reset conditions. A second switch device, SCR 101, completes the discharge circuit for capacitor 95 to the opposite terminal of the winding upon the occurrence of a fault current.

The two current storage capacitors 92 and 95 are simultaneously charged by a charging circuit which includes the line current-powered voltage multiplier network. Capacitor 92 is charged directly and capacitor 95 is charged through winding 70, isolation diode 93 and resistor 94. Diode 93 provides isolation for the trip circuit upon operation of the rest circuit.

An auxiliary contact closure is obtained in fault indicator 20 upon occurrence of a fault current in monitored conductor 21 by providing a second magnetic circuit in indicator module 22. In particular, and referring to FIGS. 5 and 8–10, the second magnetic circuit is formed by a second U-shaped magnetic pole piece 110, a reed switch 111 and a bias magnet 112. Pole piece 110, like pole piece 68, is preferably formed of a magnetic material having a relatively low coercive force, such as chrome steel. Winding 70 wraps around both pole piece 68 and pole piece 110, so that the direction of the magnetic field induced in both pole pieces is dependent on the direction of current in the winding. The lead wires of reed switch 111 are positioned in close proximity to the ends of pole piece 110 to complete the magnetic circuit. However, to avoid a short circuit across the switch the lead wires are electrically isolated from the pole pieces.

In operation, when fault indicator 20 is in a reset state with indicator flag 40 positioned as shown in FIG. 8A, and the magnetic circuit through reed switch 111 is as shown in FIG. 8B. In the absence of bias magnet 112 the magnetic field between the poles of pole piece 110 would cause the contacts of reed switch 111 to close. However, bias magnet 112 is polarized to oppose the magnetic poles as now polarized so that the field between the poles is sufficiently weakened so that the reed switch contacts do not close and no fault is signaled.

Upon occurrence of a fault, the polarity of the magnetic poles of pole piece 110 changes, as shown in FIGS. 9B and 10B. Magnet 112 now works to strengthen the magnetic field applied to the reed switch contacts, and the contacts close.

Figure 12:
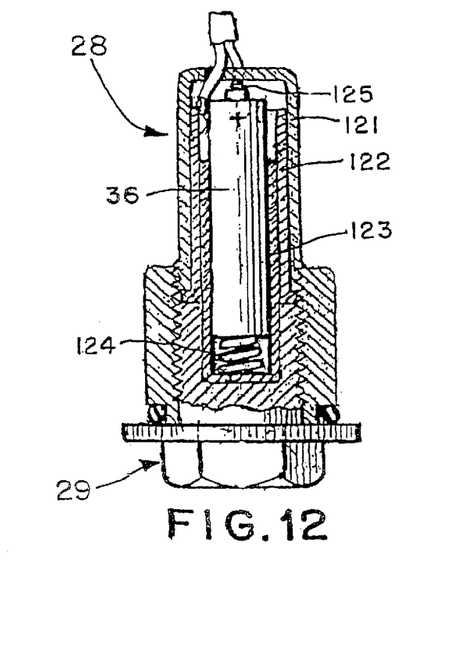
FIG. 12 is an enlarged view of the battery holder utilized in the fault indicator of FIGS. 1–11.

To prevent undesired actuation of reed switch 111 from the external magnetic field associated with conductor 25 the switch is preferably aligned with its axis generally parallel to the axis of the monitored conductor. With this alignment, to avoid actuation of the switch by the stray magnetic field of winding 50, the reed switch 111 is preferably contained within a cylindrical sleeve 116 of magnetically conductive material, such as copper, with bias magnetic 112 positioned on the outside surface of the sleeve with its axis parallel-spaced to the axis of the reed switch. However, where the monitored conductor is sufficiently spaced from the reed switch that the magnetic field of the conductor is not a factor, the reed switch can be aligned with its axis perpendicular to the axis of the actuator winding 70 as shown in FIG. 12 to minimize the effect of winding 70 on the reed switch. In this case the magnetic shield 116 may not be required.

The leads of reed switch Ill can be magnetically coupled to and electrically isolated from the magnetic poles of pole piece 110 by soldering or otherwise attaching the switch leads to metallic sleeves 117 which are fitted over sleeves 118 of electrically insulating material, such as vinyl, which in turn are fitted over the magnetic poles.

In accordance with the invention, a light indication of fault occurrence is obtained by connecting battery 36 through switch contacts 111 to a flasher circuit 120, which provides a flashing signal to signal lamp 56. Flasher circuit 120 is preferably a commercially available component adapted to power lamp 56, which is preferably a light emitting diode (LED).

With LED 56 positioned as shown behind flag 40, the light is viewable from the front of fault indicator 22 through the flag and window 41, and from the sides of the fault indicator through the transparent end portion 55 of the indicator assembly housing 30. To render the LED better viewable from the front, all or a portion of indicator flag 40 is preferably formed of a translucent material.

Battery 36 is preferably a thionyl chloride lithium battery, such as type TL-593-S manufactured by TADIRAN, Ltd. of Israel, which provides a constant 3.6 volt output to depletion. Flasher circuit 120 and LED 56 are preferably a single component, such as a type MLED-6970D13B/B manufactured by Microlamps, Inc. This component gives a flashing rate of approximately one per second. It will be appreciated that other flashing circuits may be used, including circuits discrete from the signal lamp.

Referring to FIG. 12, battery holder 28 preferably includes a cylindrical fixed portion 121 in which is provided a cylindrical metallic inner sleeve 122. This sleeve is dimensioned to receive a cylindrical metallic outer sleeve 123 attached to cap 29. When the cap is installed the outer sleeve fits coaxially within the inner sleeve to establish an electrical connection to the cap end of the battery. The outer sleeve is dimensioned to slidably receive the battery, which is engaged by a helical spring 124 within the cap, thus assisting in holding the battery in place when the cap is installed. A single transverse pin 125 establishes electrical connection to the other end of the battery.

It will be appreciated that while the interior indicator lamp arrangement of the invention has been shown incorporated in an inductively coupled current powered fault indicator, the inventive arrangement finds equal utility in capacitively coupled electrostatical power fault indicators such as those mounted on system test points, which utilize an electromagnetically actuated indicator.

Thus, a compact externally-powered fault indicator has been described which upon sensing of a fault current provides a contact closure for external signaling and control purposes. By utilizing the existing electromechanical indicator flag assembly, a minimal number of additional components are required, making the device especially well suited for economically upgrading existing fault monitoring systems.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

We claim:

1. A fault indicator for indicating the occurrence of a fault current in an electrical conductor, comprising:
    a housing;
    a battery;
    a lamp operable from said battery and viewable from the exterior of the housing;
    a magnetic circuit including a magnetic pole piece, a magnetically actuated switch and a bias magnet, said bias magnet having a magnetic polarity which opposes a magnetic field in said magnetic pole piece in one direction, and reenforces a magnetic field in said magnetic pole piece in the other direction, whereby said magnetically actuated switch is conditioned to open in response to a magnetic field in said one direction and closed in response to a magnetic field in said other direction;
    circuit means including a magnetic winding in magnetic communication with said magnetic pole piece and responsive to the current in the monitored conductor for developing a magnetic field in said pole piece in a direction to condition said switch open during normal current flow in the monitored conductor, and for developing a magnetic field in said pole piece in said opposite direction to condition said switch closed upon occurrence of a fault current in the conductor; and
    said magnetically actuated switch connecting said battery to said lamp whereby said lamp lights in said fault indicating state.

2. A fault indicator as defined in claim 1 wherein said magnetic pole piece includes a pair of spaced-apart magnetic poles, and said magnetically actuated switch is disposed between said poles.

3. A fault indicator as defined in claim 2 wherein said magnetically actuated switch includes a pair of projecting leads, and said leads are mechanically connected to but electrically isolated from said magnetic poles.

4. A fault indicator as defined in claim 3 wherein said magnetically actuated switch comprises a reed switch.

5. A fault indicator as defined in claim 4 wherein the axis of said reed switch is aligned generally parallel to the axis of said monitored conductor.

6. A fault indicator as defined in claim 5 wherein said magnetic pole piece is generally U-shaped.

7. A fault indicator for indicating the occurrence of a fault current in an electrical conductor, comprising:
    a housing;
    a battery;
    a lamp operable from said battery and viewable from the exterior of said housing;
    an indicator flag assembly including an indicator flag viewable from the exterior of the housing and a first magnetic pole piece, said indicator flag being magnetized and in magnetic communication with said first magnetic pole piece whereby said indicator flag is actuated to a reset-indicating position by a magnetic field in said first magnetic pole piece in one direction, and is actuated to a fault-indicating position by a magnetic field in said first magnetic pole piece in the opposite direction;
    a magnetic circuit including a second magnetic pole piece, a magnetically actuated switch and a bias magnet, said bias magnet having a magnetic polarity which opposes a magnetic field in said second magnetic pole piece in one direction, and reenforces a magnetic field in said second magnetic pole piece in the other direction, whereby said magnetically actuated switch is actuated open in response to a magnetic field in said one direction and closed in response to a magnetic field in said other direction;
    circuit means including a magnetic winding in magnetic communication with said first and second magnetic pole pieces and responsive to the current in the monitored conductor for developing a magnetic field in said one direction in said pole pieces to position said indicator flag to said reset indicating position and condition said magnetically actuated switch open during normal current flow in the monitored conductor, and for developing a magnetic field in said opposite direction in said pole pieces to position said indicator flag in said fault indicating position and condition said magnetically actuated contacts closed upon occurrence of a fault current in the conductor; and
    said magnetically actuated switch connecting said battery to said lamp whereby said lamp lights in said fault indicating state.

8. A fault indicator as defined in claim 7 wherein said magnetic pole piece includes a pair of spaced-apart magnetic poles, and said magnetically actuated switch is disposed between said poles.

9. A fault indicator as defined in claim 8 wherein said magnetically actuated switch includes a pair of projecting leads, and said leads are mechanically connected to but electrically isolated from said magnetic poles.

10. A fault indicator as defined in claim 9 wherein said magnetically actuated switch comprises a reed switch.

11. A fault indicator as defined in claim 10 wherein the axis of said reed switch is aligned generally parallel to the axis of said monitored conductor.

12. A fault indicator for indicating the occurrence of a fault current in an electrical conductor, comprising:

a housing;

a battery;

a lamp operable from said battery and viewable from the exterior of the housing;

a rotatably mounted indicator flag viewable from the exterior of said housing;

a first magnetic pole piece having magnetic poles in magnetic communication with said indicator flag, said flag assuming a reset-indicating position in response to a magnetic field in said first magnetic pole piece in one direction and a trip-indicating position in response to a magnetic field in said first magnetic pole piece in the other direction;

a magnetically actuated switch;

a second magnetic pole piece having magnetic poles in magnetic communication with said magnetically actuated switch, and a bias magnet opposing a magnetic field in said second magnetic pole piece in said one direction and reenforcing a magnetic field in said second magnetic pole piece in said other direction whereby said magnetically actuated switch is actuated to open in response to a magnetic field in said one direction and is actuated closed in response to a magnetic field in said second magnetic pole piece in said other direction;

circuit means including a magnetic actuator winding in magnetic communication with said first and second magnetic pole pieces for inducing magnetic field in said one direction in each of said pole pieces when said fault indicator is in a reset state, and in said other direction when said fault indicator is in a trip state;

said magnetically actuated switch connecting said battery to said lamp whereby said lamp lights in said fault indicating state.

13. A fault indicator as defined in claim 12 wherein said auxiliary magnetic pole piece includes a pair of spaced-apart magnetic poles, and said magnetically actuated switch is disposed between said poles.

14. A fault indicator as defined in claim 13 wherein said magnetically actuated switch includes a pair of projecting leads, and said leads are mechanically connected to but electrically isolated from said magnetic poles.

15. A fault indicator as defined in claim 14 wherein said magnetically actuated switch comprises a reed switch.

16. A fault indicator as defined in claim 15 wherein the axis of said reed switch is aligned generally parallel to the axis of said monitored conductor.

17. A fault indicator as defined in claims 12 wherein said auxiliary magnetic pole piece is generally U-shaped.

18. A fault indicator as defined in claim 17 wherein said actuator winding is wound on the transverse portion of said first and second U-shaped magnetic pole pieces.

* * * * *